United States Patent [19]
Green et al.

[11] Patent Number: 5,990,415
[45] Date of Patent: *Nov. 23, 1999

[54] MULTILAYER SOLAR CELLS WITH BYPASS DIODE PROTECTION

[75] Inventors: Martin Andrew Green, Waverly; Stuart Ross Wenham, Menai Heights, both of Australia

[73] Assignee: Pacific Solar Pty Ltd, New South Wales, Australia

[*] Notice: This patent is subject to a terminal disclaimer.

[21] Appl. No.: 08/849,591

[22] PCT Filed: Dec. 8, 1995

[86] PCT No.: PCT/AU95/00829

§ 371 Date: May 29, 1997

§ 102(e) Date: May 29, 1997

[87] PCT Pub. No.: WO96/18213

PCT Pub. Date: Jun. 13, 1996

[30] Foreign Application Priority Data

Dec. 8, 1994 [AU] Australia ................. PM9960

[51] Int. Cl.⁶ .......... H01L 31/06; H01L 27/142; H01L 23/62; H01L 31/18
[52] U.S. Cl. .......... 136/255; 136/258; 136/260; 136/261; 136/262; 136/264; 257/461; 257/463; 257/464; 257/106; 257/61; 438/95; 438/96; 438/97; 438/98
[58] Field of Search .............. 136/255, 258 PC, 136/258 AM, 260, 261, 262, 254, 265; 257/461, 463, 464, 106, 61; 438/95, 96, 97, 98

[56] References Cited

U.S. PATENT DOCUMENTS

| | | |
|---|---|---|
| H667 | 9/1989 | Bedair et al. . |
| 4,323,719 | 4/1982 | Green ................. 136/244 |
| 4,385,198 | 5/1983 | Rahilly . |
| 4,933,022 | 6/1990 | Swanson . |
| 5,136,353 | 8/1992 | Pankove et al. . |
| 5,248,346 | 9/1993 | Fraas et al. . |
| 5,389,158 | 2/1995 | Fraas et al. . |
| 5,461,002 | 10/1995 | Safir ........................... 437/160 |
| 5,580,395 | 12/1996 | Yoshioka et al. ............ 136/255 |
| 5,609,694 | 3/1997 | Asai ............................ 136/255 |
| 5,616,185 | 4/1997 | Kukulka ..................... 136/255 |
| 5,665,175 | 9/1997 | Safir ........................... 136/255 |
| 5,797,998 | 8/1998 | Wenham et al. ............ 136/255 |

FOREIGN PATENT DOCUMENTS

| | | |
|---|---|---|
| 024057 | 2/1981 | European Pat. Off. . |
| 0537781 | 4/1993 | European Pat. Off. . |
| 2117174 | 10/1983 | United Kingdom . |
| 2128017 | 4/1984 | United Kingdom . |
| WO95/27314 | 10/1995 | WIPO . |

OTHER PUBLICATIONS

Sproul, A. B. et al.: "Crystalline and polycrystalline silicon tandem junction solar cells: theoretical advantages" Solar Cells, Jul. 1986, Switzerland, vol. 18, NR. 1, pp. 31–40, ISSN 0379–6787 XP–002059152.

Martin A. Green: "Solar Cells—Operating Principles, Technology and System Applications", Feb. 1992, Chap. 11, pp. 212–219.

*Primary Examiner*—Alan Diamond
*Attorney, Agent, or Firm*—Jordan and Hamburg LLP

[57] ABSTRACT

A multilayer solar cell with bypass diodes includes a stack of alternating p and n type semiconductor layers 10, 11, 12, 13, 14 arranged to form a plurality of rectifying photovoltaic junctions 15, 16, 17, 18. Contact is made to underlying layers by way of a buried contact structure comprising grooves extending down through all of the active layers, the walls of each groove being doped 33, 34 with n-or p-type impurities depending upon the layers to which the respective contact is to be connected and the grooves being filled with metal contact material 31, 32. One or more bypass diodes are provided by increasing the doping levels on either side 10, 13 of one or more portions of the junctions 16 of the cell such that quantum mechanical tunnelling provides a reverse bias characteristic whereby conduction occurs under predetermined reverse bias conditions. Ideally, the doping levels in the bypass diodes is $10^{18}$ atoms/cm³ or greater and the junction area is small.

26 Claims, 3 Drawing Sheets

MULTILAYER SOLAR CELLS WITH BYPASS DIODE PROTECTION

FIELD OF THE INVENTION

This application is a 371 of PCT/AU95/00829 filed Dec. 8, 1995.

The present invention relates generally to the field of solar cell technology and in particular the invention relates to the manufacture of a solar cell with an integrated bypass diode.

The invention provides a new method for providing protection during operation and for potentially increasing manufacturing yield of these devices by the incorporation of integral bypass diodes into a multilayer structure. The features of the multilayer structure make the incorporation of these diodes feasible in a way which would be difficult with conventional devices.

BACKGROUND OF THE INVENTION

The solar cells with integrated bypass diodes are of particular interest in the manufacture of multilayer solar cell which are the subject of earlier commonly assigned Australian Patent Application No PM4834 entitled "Multiple Layer Thin Film Solar Cells" which is incorporated herein by reference.

In the prior art a bypass diode is a diode connected in reverse polarity to the diode which constitutes the solar cell. In normal practice, these bypass diodes are discrete diodes which are physically connected across individual cells or groups of cells by techniques such as soldering. In normal operation, these bypass diodes are reverse biased and do not interfere with cell operation. However, when cells have lower current output than others in the system, due to effects such as shadowing or cell damage, these diodes provide a low resistance path around the low output cells. This serves two functions. The first is to prevent excessive reverse voltage building across low output cells which can lead to cell destruction by overheating. The second role is to control the disproportionate loss of power output that such a shaded or damaged cell could introduce into the system of interconnected cells. The purpose and function of bypass diodes are well understood and widely discussed in standard texts such as Martin A. Green, "SOLAR CELLS: Operating Principles, Technology and System Applications", (Prentice-Hall, New Jersey, 1982) and S. R. Wenham, M. A. Green and M. Watt, "Applied Photovoltaics", (Bridge Printery, Sydney, 1994). Prior art integral bypass diodes serve a similar function although in general, due to their incorporation directly into the solar cell structure, lead to a reduction in the active volume of the cell with a corresponding reduction in performance even when the bypass diode is reverse biased.

Although bypass diodes are generally incorporated to provide protection and to decrease power losses during operation in the field, a new and advantageous application of the present invention is to use such diodes to maintain high production yields of modules of interconnected cells by providing automatic bypass of damaged or poorly performing cells within the module. One strategy, well suited to module fabrication where there is no prior testing of individual cells, is to include a small number of additional cells so that a guaranteed minimum output will be achieved even in the event of a small number of cell failures.

SUMMARY OF THE INVENTION

According to a first aspect, the present invention provides a solar cell including a plurality of doped semiconductor regions defining a rectifying junction of a photovoltaic cell, at least a portion of the junction forming a bypass diode having a reverse bias characteristic whereby conduction occurs under predetermined reverse bias conditions.

According to a second aspect the present invention provides a solar cell including a plurality of doped semiconductor regions defining a first rectifying junction of a photovoltaic cell and a second rectifying junction effectively connected in parallel to and with the same polarity as the first rectifying junction, at least a portion of the second junction forming a bypass diode having a reverse bias characteristic whereby conduction occurs under predetermined reverse bias voltage conditions.

The junction portion forming the bypass diode is preferably formed by providing high doping levels in each of the semiconductor regions defining the bypass diode junction such that quantum mechanical tunnelling occurs when the junction is reverse biased to the predetermined value.

Preferably, doping levels in the semiconductor regions defining the bypass diode are greater than $10^{18}$ $cm^{-3}$ (atoms/$cm^3$).

In the past the qualities required for the desired reverse bias conduction have been considered detrimental to photovoltaic performance and have, therefore, been deliberately avoided, even when adjacent heavily doped n-type and p-type regions exist. In the present invention, it is proposed that such properties be deliberately controlled to enhance this effect. Whereas these types of junctions have been deliberately avoided in the past, they are included in the present invention with sufficiently small area to avoid significant impact on the photovoltaic performance.

For example, in embodiments having bypass diode doping levels that give reverse conduction, with reverse bias voltages less than 3 volts and in particular less than 1 volt, the total junction area having this level of doping will be arranged to be small relative to the active photovoltaic junction area.

In one embodiment of the invention a multilayer, multijunction photovoltaic cell is provided with at least one junction region formed as a bypass diode. In this embodiment the bypass diode junction is formed by a pair of layers of the multilayer cell. The bypass junction may include the entire junction formed between two adjacent layers of the multilayer cell or alternatively the bypass junction may be restricted to a portion of the junction formed between the two adjacent layers, depending upon the doping level of the bypass junction portion.

Preferably the multilayer structure includes at least three layers of alternate polarity material defining p-n junctions between each pair of alternate layers, at least three layers having a thickness which is not substantially greater than a minority carrier diffusion length for the dopant concentration of the material in the respective layer.

Preferably the doped layers will have a thickness which is less than the minority carrier diffusion length for the respective doped material.

Cells may be of doped crystalline or polycrystalline silicon, amorphous silicon and its alloys, cadmium telluride, cadmium sulphide, copper indium diselenide or alloys incorporating gallium and/or sulphur or other semiconductor material. In cells comprising a stack of silicon layers, relatively thin layers of silicon/germanium alloy could also be included. Layers of insulating material such as silicon oxide or nitride could also be interleaved within the stack.

In embodiments based upon silicon material, typically maximum dopant concentrations within at least 3 layers of $10^{17}$ atoms/cm$^3$ or more will be used, with doped layer thicknesses typically in the range of 0.1 to 40 µm. In silicon material the dopant concentration will preferably be greater than $10^{17}$ atom/cm$^3$ over at least 50% of the bulk of each layer and more preferably will range between $10^{17}$ and $10^{18}$ atoms/cm$^3$ over substantially all of each layer.

In preferred embodiments using silicon material each layer will be between 0.2 and 15 microns thick.

In silicon cells the top layer will preferably have a dopant concentration of $10^{18}$ atoms/cm$^3$ or greater.

According to a further aspect, the present invention provides a method of forming a thin film solar cell including the step of (a) forming onto a substrate a plurality of alternatively doped thin layers of semiconductor material to form at least one rectifying p-n junction, (b) during the forming step, forming at least one p-n junction portion of the solar cell with doping levels of $10^{18}$ atoms/cm$^3$ in the adjacent p and n type regions forming said portion.

In a preferred embodiment, this aspect further includes the steps of (c) forming sequentially at least two sets of grooves in the plurality of layers to expose some or all of the doped layers, (d) forming in at least one of the grooves a p-type surface region over the entire surface of the groove or grooves, (e) forming in at least one other of the grooves an n-type surface region over the entire surface of the respective groove or grooves, (f) forming a metal contact in each of the grooves respectively to make contact with the p-type and n-type surface regions. According to yet a further aspect, the present invention provides a method of forming a thin film solar cell including the steps of (a) forming onto a substrate a plurality of alternatively doped thin layers of semiconductor material to form at least one rectifying p-n junction, at least one heavily doped portion of one layer of the solar cell having a doping level of greater than $10^{18}$ atoms/cm$^3$, (b) forming sequentially at least two sets of grooves in the plurality of layers to expose some or all of the doped layers, at least one of the grooves passing through and exposing the at least one heavily doped portion, (c) forming in at least one of the grooves a p-type surface region over the entire surface of the groove or grooves, (d) forming in at least one other of the grooves an n-type surface region over the entire surface of the respective groove or grooves, the surface of the groove or grooves exposing the heavily doped portion being of opposite dopant type to the heavily doped portion and having a doping level, at least in a region adjacent the heavily doped portion, of $10^{18}$ atoms/cm$^3$ or greater.

In a preferred embodiment, this aspect further includes the step of (e) forming a metal contact in each of the grooves respectively to make contact with the p-type and n-type surface regions.

Preferably the substrate will be selected from one of, crystalline, polycrystalline or amorphous silicon, graphite, steel, ceramic or glass and the active layers are formed by a process or processes which may be selected from chemical or physical vapour deposition, solution growth, liquid phase epitaxy and plasma deposition and recrystallization.

Preferably also, the layers formed during the forming steps have a thickness not substantially greater than the minority carrier diffusion length of the respective doped material, In another embodiment of the invention, a photovoltaic cell is provided, the cell having a buried contact arranged to directly contact a semiconductor region of a first dopant type and being separated from a heavily doped region of a second dopant type by a thin heavily doped layer of semiconductor material of the first dopant type.

Preferred embodiments of the invention employ a multilayer thin film silicon solar cell structure, however, it will be recognised that the principle of the invention is also applicable to other material and structures.

BRIEF DESCRIPTION OF THE DRAWINGS

Embodiments of the invention will now be described with reference to the accompanying drawings in which.

DETAILED DESCRIPTION OF THE EMBODIMENTS

Figure 1:
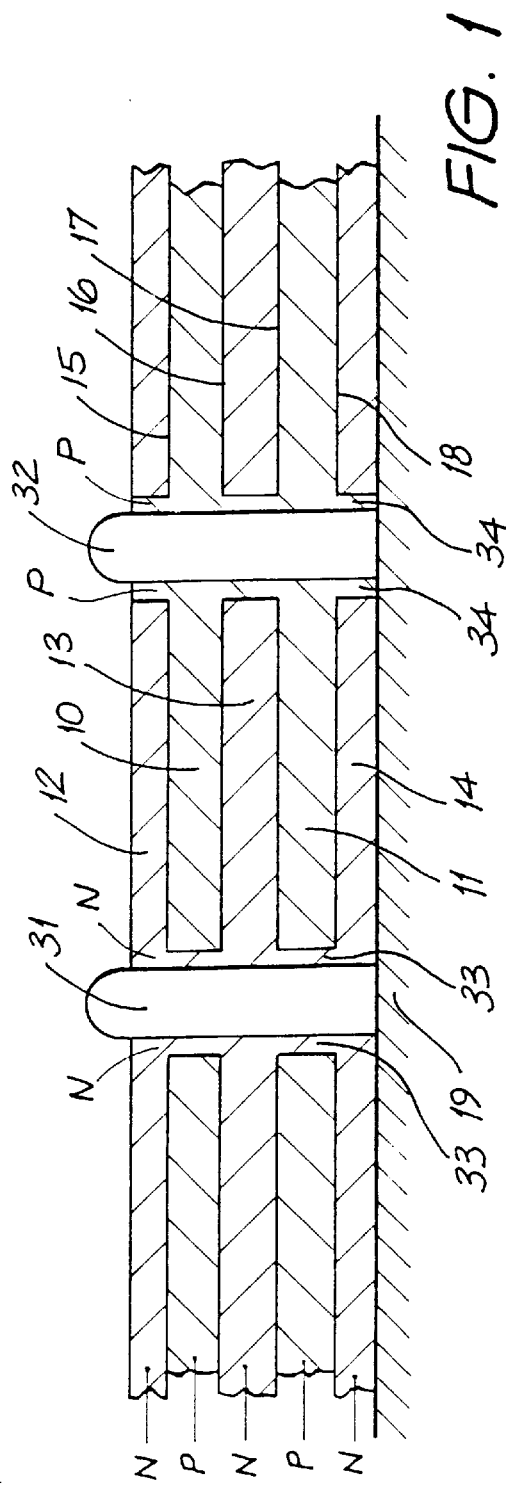
FIG. 1 illustrates the basic structure of a solar cell according to the present invention, having multiple interleaved n and p-type doped crystalline or polycrystalline silicon layers, using buried contacts to make contact to buried layers.

Referring to FIG. 1, embodiments of the present invention have a structure comprising a plurality of alternate p-type semiconductor layers 10, 11 and n-type semiconductor layers 12, 13, 14 forming rectifying junctions 15, 16; 17, 18 therebetween. The alternating semiconductor layers 10–14 are formed on and supported by a substrate 19 which may be selected from crystalline, polycrystalline or amorphous silicon, graphite, steel, ceramic, glass or any other material onto which a thin semiconductor film can be successfully formed. Contacts 31, 32 are formed respectively with the n-type layers 12, 13, 14 and the p-type layers 10, 11 by first forming vertical grooves to expose all of the layers of active semiconductor material and then, for those contacts which are connecting n-type regions, forming a vertical n-type doped layer 33 which connects with all of the n-type layers 12, 13, 14 and establishes a junction with all of the p-type layers 10, 11. Similarly, a p-type doped layer 34 is formed in the groove for the contact connecting the p-type layers 10, 11, the vertical p-type layer 34 establishing a junction with the exposed n-type layers 12, 13, 14. The metal contacts 31, 32 are then formed within the grooves lined by the n-type and p-type layers 33, 34.

The active semiconductor layers 10-14 shown in FIG. 1 are thin films which may be formed on the substrate 19 by any of a number of known techniques, including chemical vapour deposition, solution growth, liquid phase epitaxy and plasma deposition and recrystallization, with the dopant being incorporated in each case during or after the layer formation step.

The multilayer solar cell described with reference to FIGS. 1 and 2 offers sufficient flexibility in the selection of the properties of the layers within the completed cell to allow bypass diodes to be incorporated into the cell in a novel way as part of the basic cell processing. Specifically, the bypass diodes are implemented in multilayer cell embodiments by using junctions between regions which are heavily doped with silicon to values of dopant concentration greater than $10^{18}$ $cm^{-3}$. The bypass action of the diode is obtained by using the reverse characteristics of junctions formed between such heavily doped regions. When such junctions are reverse biased, the energies of the conduction and valence band in the n- and p-type region respectively overlap, in that electrons in both have the same energy. When both n-type and p-type regions are heavily doped, electrons are able to transfer from the valence band in the p-type material to the conduction band in the n-type material by quantum mechanical tunnelling processes. These become more efficient as the reverse bias across the junction increases and the electric field strength in the junction region between the n-type and p-type regions correspondingly increases, giving good conduction in the reverse bias direction of the diode. The properties of such heavily doped junctions are discussed in standard texts such as S. M. Sze, "Physics of Semiconductor Devices", Wiley, New York, 1981. These properties, however, allow a junction of the same polarity as that of the main cell to provide the same protection as normally provided by a bypass diode of reverse polarity.

A possible complication, however, is that shunting of this junction or recombination through the junction at normal operating voltages for the main solar cell, will cause degradation to the main cell performance. These losses can be kept to negligible levels by appropriately controlling the dimensions of the aforementioned heavily doped diode (particularly junction area), its location and to some extent the corresponding doping concentrations. In the multilayer solar cells, this can be achieved without significantly adding to the cost or complexity.

In comparison to the use of prior art integral bypass diodes of opposite polarity, some embodiments of the present bypass diode approach can be incorporated into multilayer solar cells without significantly sacrificing any of the active volume of the solar cell. Consequently, even in the event of trouble free operation for all cells in a module, a smaller penalty is paid in terms of module performance and cost as a result of including such diodes.

The multilayer cell provides opportunities for incorporation of such diodes which are not present in conventional devices. In one embodiment of the invention illustrated in FIG. 3, diodes with these properties can be formed between adjacent layers within the multilayer stack by selecting appropriate properties for these adjacent layers, particularly in relation to their doping levels. Due to the flexibility in design of multilayer devices, this can be achieved without severe detriment to the performance of the overall device. For example, very heavily doped layers can be made very thin to maintain their minority carrier collecting ability.

Figure 4:
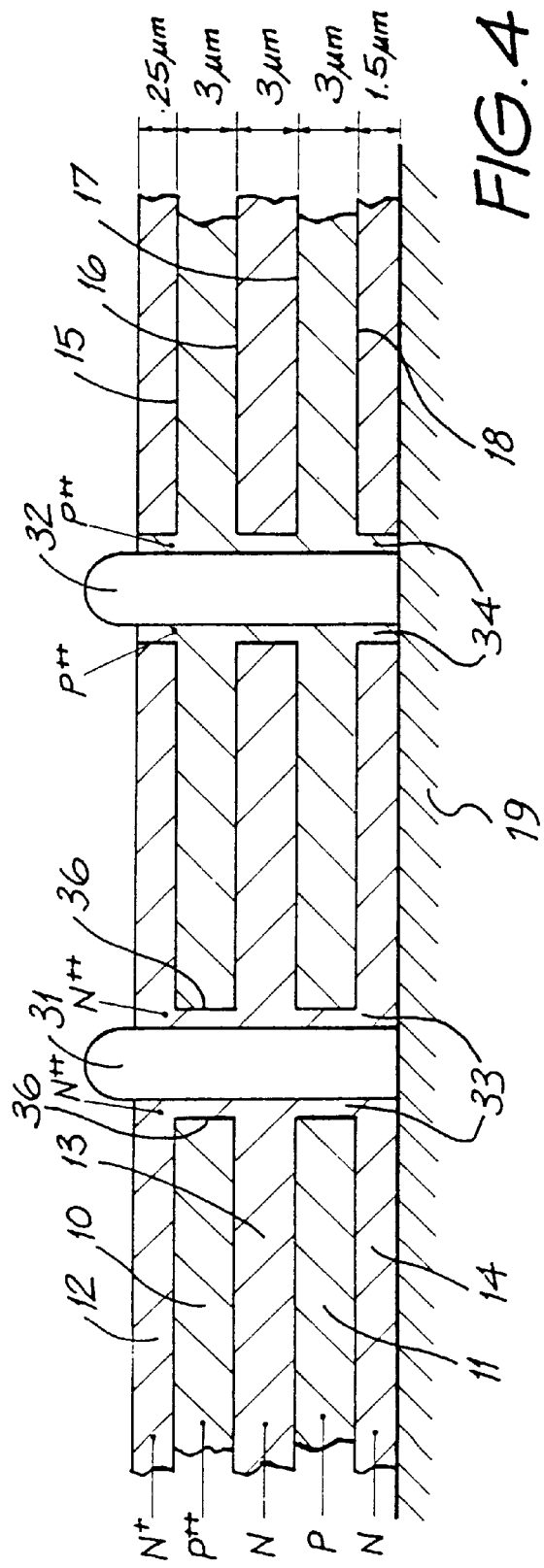
FIG. 4 illustrates solar cell structure of FIG. 3 but with the bypass diode formed by the junction between a doped layer and the doped region lining the groove wall.

In a second embodiment of the invention illustrated in FIG. 4, the diode with the required properties can be formed between the doped layer lining the groove walls present within the multilayer structure and one or more layers within the multilayer stack.

Figure 5:
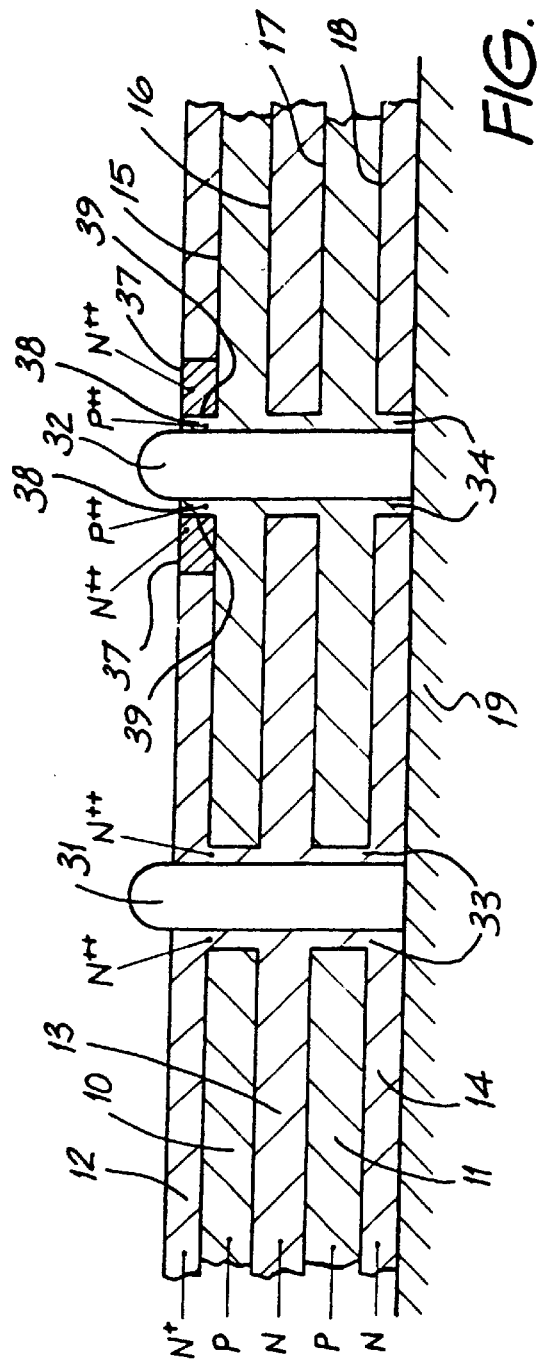
FIG. 5 illustrates a further embodiment of the invention having a similar structure to that of FIGS. 3 and 4 but with an additional doped region incorporated to provide the bypass diode action.

In a third embodiment of the invention illustrated in FIG. 5, the diode with the required properties can be provided by incorporating additional doped regions as further described. This approach would also be suitable for multilayer devices which do not have grooves.

Figure 2:
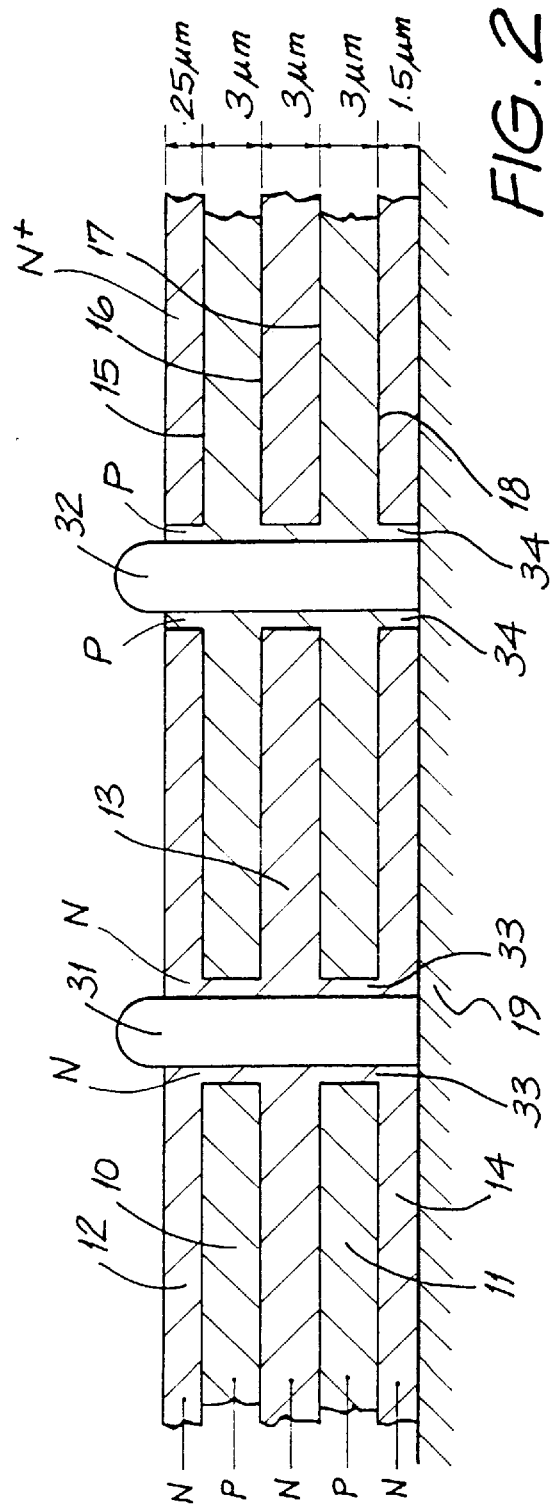
FIG. 2 illustrates the same solar cell structure as that of FIG. 1 but with dimensions given for an embodiment using a poor quality silicon material.
Figure 3:
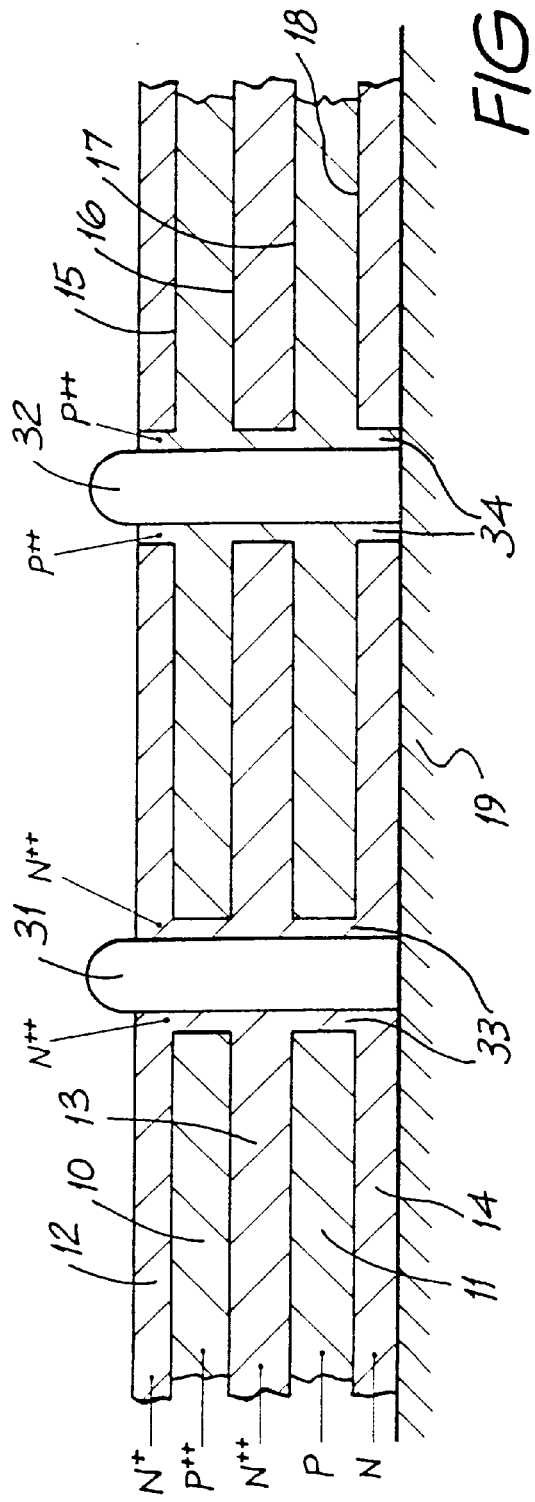
FIG. 3 illustrates the basic structure of FIG. 1 with a bypass diode formed between two adjacent layers within the stack.

Referring to FIG. 3, this enhanced embodiment of the present invention has a structure identical to that of FIGS. 1 and 2 with the exception that one pair of layers 10, 13 have been selected to be more highly doped than the other layers 11, 12, 14, to provide a diode junction 16 with the desired reverse bias characteristics. Best bypassing action will be obtained when these layers are very heavily doped. However, excessive doping can be detrimental to the performance of the solar cell during normal operation. If both layers are doped above $5 \times 10^{19} cm^{-3}$, it is possible for the overlap of the bands previously mentioned to occur at zero bias and current flow across the diode junction 16 by quantum mechanical tunnelling will occur even when it is forward biased. This will subtract from the photocurrent generated by the cell and may decrease the cell performance under normal operating conditions. Minority carrier properties of the material also decrease with increasing doping level, rendering these regions less effective as active cell material. Values of doping above $10^{20}/cm^3$ could, however, be accommodated if the total junction area with such values were small (as in the embodiment of FIGS. 4 and 5).

An additional advantage which also follows from the use of such heavily doped layers is their gettering ability. Heavily doped phosphorus layers in particular are known to be very effective in gettering defects and impurities from neighbouring regions. By having a number of such heavily doped layers interspersed within the stack, impurities would be gettered to the internal regions of these layers. Gettering to internal regions was not previously possible in solar cells. However, by having multiple regions providing multiple gettering layers, the gettered impurities can be concentrated in regions where they will do least harm to the overall device performance. Gettering of impurities and defects from junction depletion regions is particularly important in low quality material.

The method of forming the bypass diode effect shown in FIG. 3 would also be applicable to other methods of contacting the layers apart from those dependent on the grooves and would be applicable for implementations where the groove was absent.

Rather than having the entire layer heavily doped as shown in FIG. 3, only the region near the junction 17 need to be heavily doped. This would allow the junction with the required properties to be incorporated without sacrificing other desirable properties of the layers involved.

Similar considerations apply to the embodiment of FIG. 4 where the diode with the required properties is formed between one or more layers 10 in the stack and the doped walls 33 of the metallized groove 31 to form a junction 36. The junction area with appropriate properties is greatly reduced in this configuration giving more design flexibility. Doping levels can be heavier without causing problems of the same severity as previously described. The regions of interception of the layers with the groove walls where doping levels are highest on both sides will automatically become the areas of highest current density and provide the most effective bypass diode action. Again, the distributed gettering benefits previously mentioned are applicable to this case.

In the third embodiment of FIG. 5, an additional layer region 37 is provided in the top layer 12 in order to create the bypass diode junction 39 with the doped wall region 38 of the metallized groove 32. In this case, a separate heavily diffused region is added in the area 37 close to the groove.

Alternatively, properties of the layers may be manipulated in other ways to give higher doping density in chosen areas. This approach is also applicable to structures without the metallized groove 31, 32.

Figure 6:
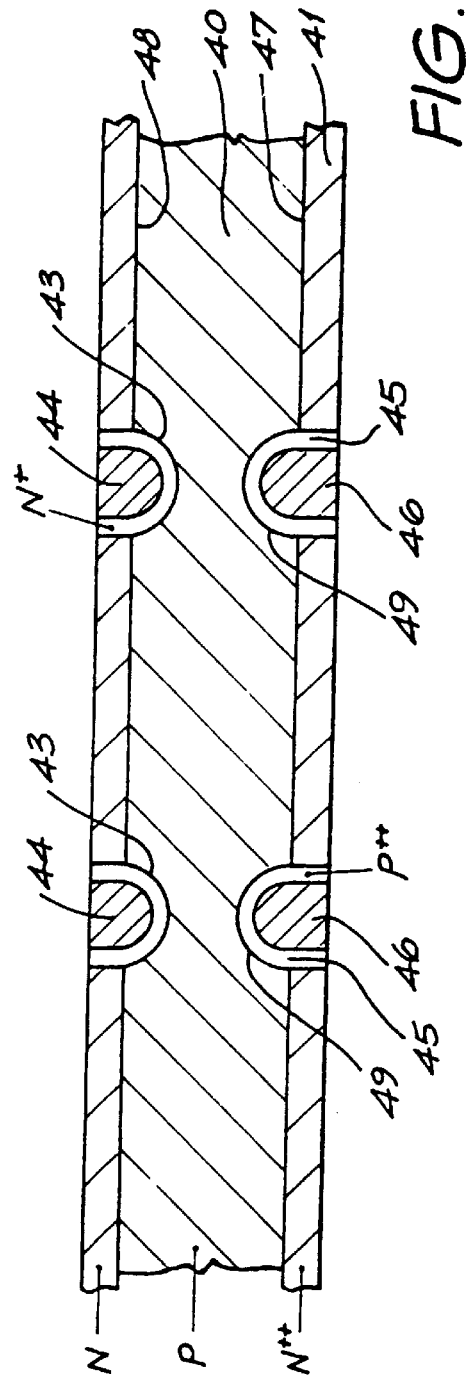
FIG. 6 illustrates a simpler 3-layer structure also incorporating bypass diodes.

The device of FIG. 6 resembles a more conventional solar cell. In this case, similar techniques can be used to form the bypass diode in the contact regions. In the case shown, the junction 49 is formed between the n-type region 41 of the rear "floating" junction 47 and the p-type contact areas 45 within the grooves and the diffused region of the grooves on the rear surface of the cell. In this instance, current is able to flow between the n-type layers by junction interaction in a similar manner to a phototransistor where the base current is provided by the light generated carriers. Similar techniques could be used if the rear junction was not "floating" but was contacted either directly or via contact paths through the substrate to the front contact. Again, similar implementations not relying on the presence of the grooves would be possible.

A process which can be used for the manufacture of the cell structure of FIG. 3 could have the following process steps:

1. Prepare substrate onto which the cell is to be deposited.
2. Deposit an n-type silicon layer by Chemical Vapour Deposition (CVD).
3. Deposit a p-type silicon layer over the previous layer by CVD.
4. Deposit an n-type silicon layer over the previous layer by CVD, this layer having a minimum doping level of $10^{18}$ atoms/cm$^3$ of the junction with the next deposited layer.
5. Deposit a p-type silicon layer over the previous layer by CVD, this layer having a minimum doping level of $10^{18}$ atoms/cm$^3$ at the junction with the previous layer.
6. Deposit an n-type silicon layer over the previous layer by CVD.
7. Apply a masking/surface passivating layer.
8. Form a first set of grooves by either laser or mechanical scribing followed by groove cleaning.
9. Form an n-type doped layer on the walls of first groove by diffusion or CVD.
10. Apply a masking layer to wall surfaces of the first groove.
11. Form a second set of grooves followed by groove cleaning.
12. Form a p-type doped layer on the walls of the second groove by diffusion or CVD.
13. Chemically etch to expose silicon in the grooves.
14. Electroless plating of nickel to contact silicon in the grooves.
15. Sintering of nickel.
16. Apply copper conductors by electroless plating of copper over the nickel.
17. Deposit silver capping layer over the copper.

Although drawings are shown for flat interfaces, in practice these could be structured or textured to improve light trapping in cell.

It will be appreciated by those skilled in the art, that variations in the above with respect to material selection, fabrication techniques, and structure dimensions can be used without departing from the spirit of the invention.

We claim:

1. A solar cell including at least three doped semiconductor regions defining at least two rectifying junctions of a photovoltaic cell, at least a portion of one of the junctions forming a bypass diode having a reverse bias characteristic such that conduction occurs when the at least a portion of the one of the junctions is reversed biased by a potential greater than or equal to a reverse bias threshold.

2. The solar cell of claim 1 wherein the junction portion forming the bypass diode is formed by providing high doping levels in each of the semiconductor regions defining the bypass diode junction such that quantum mechanical tunnelling occurs when the at least a portion of the one of the junctions is reversed biased by the potential greater than or equal to the reverse bias threshold.

3. The solar cell of claim 2 wherein the semiconductor regions defining the bypass diode are doped to a level of $10^{18}$ cm$^{-3}$ (atoms/cm$^3$) or greater.

4. The solar cell of claim 3 wherein the at least three doped semiconductor regions include an active photovoltaic junction area and a total junction area of the bypass diode is arranged to be small relative to the active photovoltaic junction area.

5. The solar cell of claim 4 wherein the bypass diode has a reverse bias conduction voltage of less than 3 volts.

6. The solar cell of claim 5 wherein the bypass diode has a reverse bias conduction voltage of less than 1 volt.

7. The solar cell as claimed in claim 1 wherein each of the at least three doped regions is a layer of a multilayer cell and the junction of the bypass diode is formed by an adjacent pair of the layers.

8. The solar cell of claim 7 wherein the junction of the bypass diode includes an entire junction formed between the adjacent pair of the layers of the multilayer cell.

9. The solar cell of claim 7 wherein the junction of the bypass diode is restricted to a portion of the junction formed between the two adjacent layers.

10. The solar cell as claimed in claim 1 wherein the solar cell includes a buried contact which directly contacts a semiconductor region of a first dopant type and is separated from a heavily doped region of a second dopant type by a thin heavily doped layer of semiconductor material of the first dopant type.

11. The solar cell of claim 1, having at least three layers formed of alternate polarity material layers defining p-n junctions between each pair of the alternate layers, at least three layers having a thickness which is not substantially greater than a minority carrier diffusion length for the dopant concentration of the material in the respective layer.

12. The solar cell of claim 11 wherein the doped layers have a thickness which is less than the minority carrier diffusion length for the respective doped material.

13. The solar cell of claim 11 wherein the cell material is selected from one or more of doped crystalline or polycrystalline silicon, amorphous silicon and its alloys, cadmium telluride, cadmium sulphide, copper indium diselenide and its alloys with gallium and sulphur.

14. The solar cell of claim 11 wherein the solar cell includes a stack of silicon layers and relatively thin layers of silicon/germanium alloy.

15. The solar cell of claim 11 wherein the solar cell material is silicon, and doped layer thicknesses are in the range of 0.1 μm to 40 μm.

16. The solar cell of claim 15 wherein each layer is between 0.2 μm and 15 μm thick.

17. A method of forming a thin film solar cell including the steps of:

(a) forming onto a substrate at least three alternatively doped thin layers of semiconductor material to form at least two rectifying p-n junctions, and (b) during the forming step, forming at least one p-n junction portion of the solar cell with doping levels of $10^{18}$ atoms/cm$^3$ or greater in the adjacent p and n type regions forming said portion.

18. The method of claim 17 further including the steps of (c) forming sequentially at least two sets of grooves in the alternatively doped thin layers of semiconductor material to expose some or all of the doped layers, (d) forming in at least one of the grooves a p-type surface region over the entire surface of the groove or grooves, (e) forming in at least one other of the grooves an n-type surface region over the entire surface of the respective groove or grooves, and (f) forming a metal contact in each of the grooves respectively to make contact with the p-type and n-type surface regions.

19. The method of claim 17 wherein each layer has a thickness not substantially greater than the minority carrier diffusion length of the respective doped material.

20. The method of claim 17 wherein the substrate is selected from one of, crystalline, polycrystalline or amorphous silicon, graphite, steel, ceramic or glass.

21. The method of claim 17 wherein the alternatively doped thin layers of semiconductor material are formed by a process or processes selected from chemical or physical vapour deposition, solution growth, liquid phase epitaxy and plasma deposition and recrystallization.

22. A method of forming a thin film solar cell including the steps of (a) forming onto a substrate a plurality of alternatively doped thin layers of semiconductor material to form at least one rectifying p-n junction, at least one heavily doped portion of one layer of the solar cell having a doping level of greater than $10^{18}$ atoms/cm$^3$ (b) forming sequentially at least two sets of grooves in the plurality of layers to expose some or all of the doped layers, at least one of the grooves passing through and exposing the at least one heavily doped portion, (c) forming in at least one of the grooves a p-type surface region over the entire surface of the groove or grooves, and (d) forming in at least one other of the grooves an n-type surface region over the entire surface of the respective groove or grooves, the surface of the groove or grooves exposing the heavily doped portion being of opposite dopant type to the heavily doped portion and having a doping level, at least in a region adjacent the heavily doped portion, of $10^{18}$ atoms/cm$^3$ or greater.

23. The method of claim 22 further including the step of (e) forming a metal contact in each of the grooves respectively to make contact with the p-type and n-type surface regions.

24. The method of claim 22 wherein each layer has a thickness not substantially greater than the minority carrier diffusion length of the respective doped material.

25. The method of claim 22 wherein the substrate is selected from one of, crystalline, polycrystalline or amorphous silicon, graphite, steel, ceramic or glass.

26. The method of claim 22 wherein the plurality of alternatively doped thin layers of semiconductor material are formed by a process or processes selected from chemical or physical vapour deposition, solution growth, liquid phase epitaxy, and plasma deposition and recrystallization.

* * * * *